United States Patent
Kang et al.

(10) Patent No.: US 7,521,810 B2
(45) Date of Patent: Apr. 21, 2009

(54) CHIP STACK PACKAGE AND MANUFACTURING METHOD THEREOF

(75) Inventors: In-Ku Kang, Cheonan-si (KR); Pyoung-Wan Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 315 days.

(21) Appl. No.: 11/502,427

(22) Filed: Aug. 11, 2006

(65) Prior Publication Data
US 2007/0108574 A1 May 17, 2007

(30) Foreign Application Priority Data
Aug. 11, 2005 (KR) .................. 10-2005-0073720

(51) Int. Cl.
*H01L 23/48* (2006.01)
*H01L 23/52* (2006.01)
*H01L 29/40* (2006.01)

(52) U.S. Cl. ........... 257/777; 257/678; 257/E25.013; 257/E23.021; 257/E21.503; 257/666

(58) Field of Classification Search ........... 257/678, 257/777, E25.013, E21.503, E23.021
See application file for complete search history.

(56) References Cited

U.S. PATENT DOCUMENTS 6,780,749 B2  8/2004  Masumoto et al.
7,215,026 B2 *  5/2007  Park et al. .............. 257/737
2004/0262774 A1 *  12/2004  Kang et al. .............. 257/777

FOREIGN PATENT DOCUMENTS

| JP | 10-027880 | 1/1998 |
| JP | 2003-303847 | 10/2003 |
| JP | 2004-253693 | 9/2004 |
| KR | 1020020062857 | 7/2002 |
| KR | 1020030066865 A | 8/2003 |
| KR | 1020050001159 | 1/2005 |
| KR | 1020050001159 A | 1/2005 |

OTHER PUBLICATIONS

Office Action for corresponding Korean Appln. No. 10-2005-0073720.

* cited by examiner

*Primary Examiner*—Zandra Smith
*Assistant Examiner*—Telly D Green
(74) *Attorney, Agent, or Firm*—Harness, Dickey & Pierce, P.L.C.

(57) ABSTRACT

A chip stack package may include a package substrate, a plurality of semiconductor chips mounted on the package substrate, bonding wires electrically connecting the semiconductor chips to the package substrate, and spacers interposed between the adjacent semiconductor chips. Each of the spacers may include a plurality of metal bumps. The spacers may be higher than the highest point of the bonding wire from the active surface of the semiconductor chip.

14 Claims, 10 Drawing Sheets

CHIP STACK PACKAGE AND MANUFACTURING METHOD THEREOF

PRIORITY STATEMENT

This U.S. non-provisional application claims priority under 35 U.S.C. § 119 from Korean Patent Application No. 2005-73720 filed Aug. 11, 2005, the contents of which are incorporated herein by reference.

BACKGROUND

1. Field of the Invention

Example embodiments of the present invention may generally relate to a semiconductor chip stack structure and method thereof, and more particularly, to a chip stack package and a method for manufacturing the chip stack package.

2. Description of the Related Art

A chip stack package may include a plurality of semiconductor chips that may be mounted on a package substrate. Electrical connections may be provided to electrically connect the semiconductor chips to the package substrate. A space may be provided between an upper chip and a lower chip to accommodate the electrical connections between the lower chip and the substrate. An adhesive layer may be interposed between the upper chip and the lower chip.

For example, as shown in FIG. 1, a chip stack package may include a package substrate 110, a first chip 121 that may have bonding pads 123, a second chip 122 that may have a back surface 122b, bonding wires 140, and an adhesive layer 130 that may be interposed between the first chip 121 and the second chip 122.

A liquid adhesive may be applied to the first chip 121. The second chip 122 may be stacked on the first chip 121. Upon stacking, heat and pressure may be applied to the first chip 121, which may reduce the distance between the first chip 121 and the second chip 122 so that the bonding wires 140 of the first chip 121 may contact with the back surface 122b of the second chip 122. As a result, electrical interference may occur between the bonding wires 140 and the second chip 122, and/or bonding faults of the bonding wires 140 may occur.

As shown in FIG. 2, a chip stack package may include a package substrate 210, a first chip 221 that may have an active surface 221a, a second chip 222, bonding wires 240, and an adhesive layer 230 that may be interposed between the first chip 221 and the second chip 222. The adhesive layer 230 may have spherical spacers 250. The diameter of the spherical spacers 250 may be greater than the height (h) of the bonding wire 240 from the active surface 221a of the first chip 221.

Heat and pressure may be applied to the first chip 221 upon stacking the second chip 222 on the first chip 221. At this time, the spacers 250 may maintain the distance between the first chip 221 and the second chip 222. In this way, electrical interference that may be caused by mechanical contact between the second chip 222 and the bonding wires 240 of the first chip 221 may be reduced, and/or bonding faults of the bonding wires 240 may be reduced.

Although the conventional structures are generally thought to provide acceptable performance, they are not without shortcomings. For example, the spacers 250 may be fabricated from one of silica, polymer and/or coated metals. A protective layer may be provided on the active surface 221a of the first chip 221. The protective layer may be fabricated from an insulating resin, for example polyimide. Thermal stresses and/or mechanical shocks, which may be caused by the difference between the coefficients of thermal expansion of the spacers 250 and that of the protective layer of the first chip 221, may be applied to the active surface 221a of the first chip 221. Such stresses and/or mechanical shocks may crack the protective layer of the first chip 221 and/or damage the circuit patterns of the first chip 221.

SUMMARY

According to an example, non-limiting embodiment, a package may include a substrate having wiring patterns. A first semiconductor chip may have an active surface with bonding pads and nonconductive dummy pads, and a back surface opposite to the active surface. The first semiconductor chip may be mounted on the substrate. A second semiconductor chip may have an active surface with bonding pads, and a back surface opposite to the active surface. The second semiconductor chip may be mounted on the first semiconductor chip. Bonding wires may electrically connect the bonding pads of the first and the second semiconductor chips to the wiring patterns of the package substrate. Spacers may be interposed between the first and the second semiconductor chips. The spacers provided on the nonconductive dummy pads of the first semiconductor chip, each of the spacers including a plurality of metal bumps.

According to another example, non-limiting embodiment, a method for manufacturing a package may involve mounting a first chip on a package substrate. The first chip may have dummy pads. The first chip may be connected to the package substrate using first bonding wires. A plurality of metal bumps may be connected together to form a spacer on each of the dummy pads. The spacers may be higher than the highest point of the first bonding wires. An adhesive layer may be provided on the first chip. A second chip may be mounted on the adhesive layer. The second chip may be connected to the package substrate using second bonding wires.

According to another example, non-limiting embodiment, a package may include a substrate. A first semiconductor chip may be mounted on the substrate and electrically connected to the substrate. The first semiconductor chip may have an active surface with a nonconductive dummy pad. A second semiconductor chip may be mounted on the first semiconductor chip. The second semiconductor chip may be electrically connected to the substrate. A spacer may be interposed between the first and the second semiconductor chips. The spacer may be provided on the nonconductive dummy pad of the first semiconductor chip. The spacers may include a stack of bumps.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

The drawings are provided for illustrative purposes only and are not drawn to scale. The spatial relationships and relative sizing of the elements illustrated in the various embodiments may be reduced, expanded and/or rearranged to improve the clarity of the figure with respect to the corresponding description. The figures, therefore, should not be interpreted as accurately reflecting the relative sizing or positioning of the corresponding structural elements that could be encompassed by an actual device manufactured according to example embodiments of the invention.

DETAILED DESCRIPTION OF EXAMPLE, NON-LIMITING EMBODIMENTS

Example, non-limiting embodiments of the present invention will be described with reference to the accompanying drawings. This invention may, however, be embodied in many different forms and should not be construed as limited to example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Well-known structures and processes are not described or illustrated in detail to avoid obscuring the present invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 1:
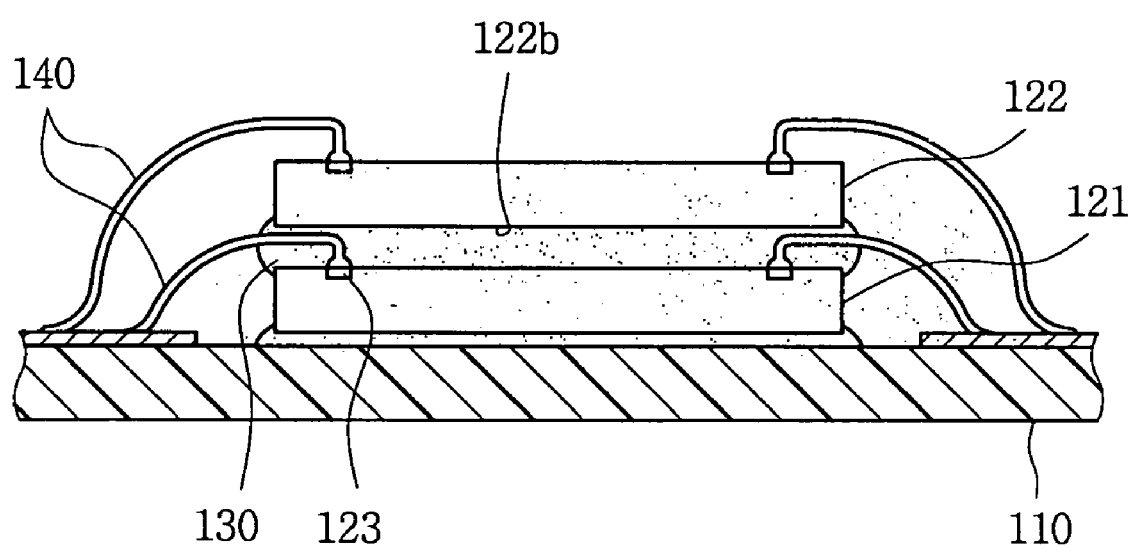
FIG. 1 is a cross-sectional view of an example of a conventional chip stack package.
Figure 2:
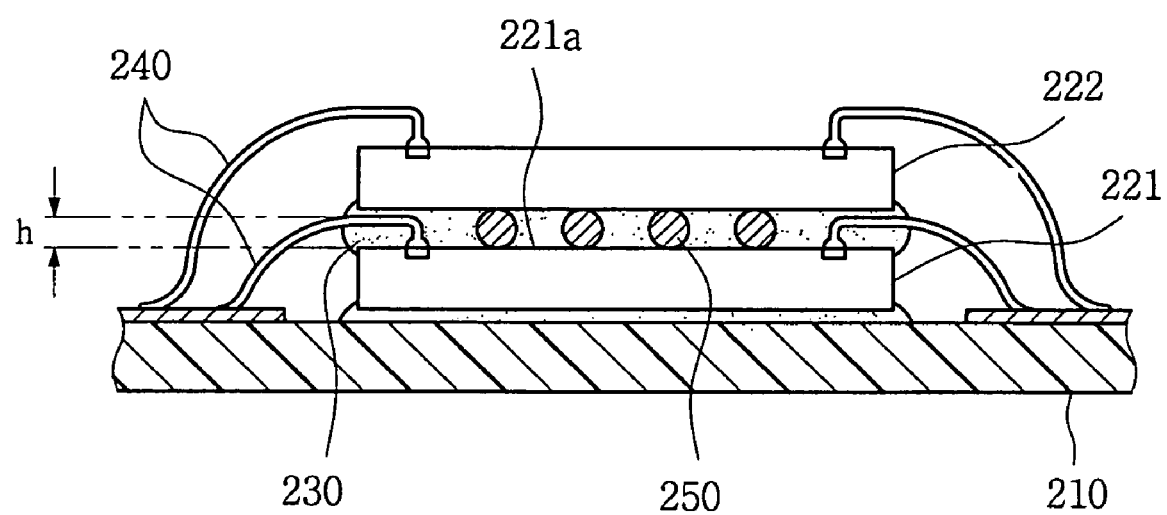
FIG. 2 is a cross-sectional view of another example of a conventional chip stack package.
Figure 3A:
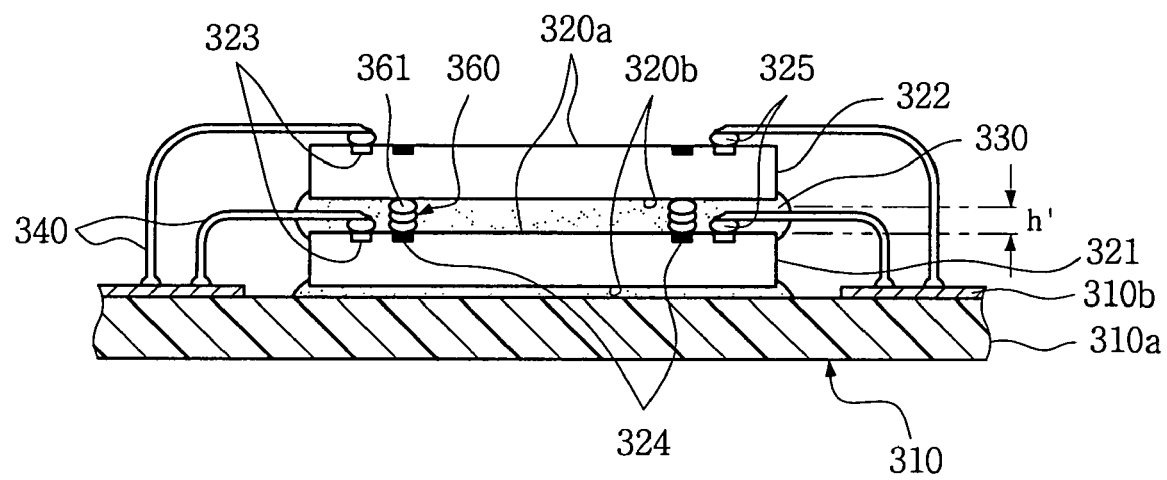
FIG. 3A is a cross-sectional view of a chip stack package in accordance with an example embodiment of the present invention.
Figure 3B:
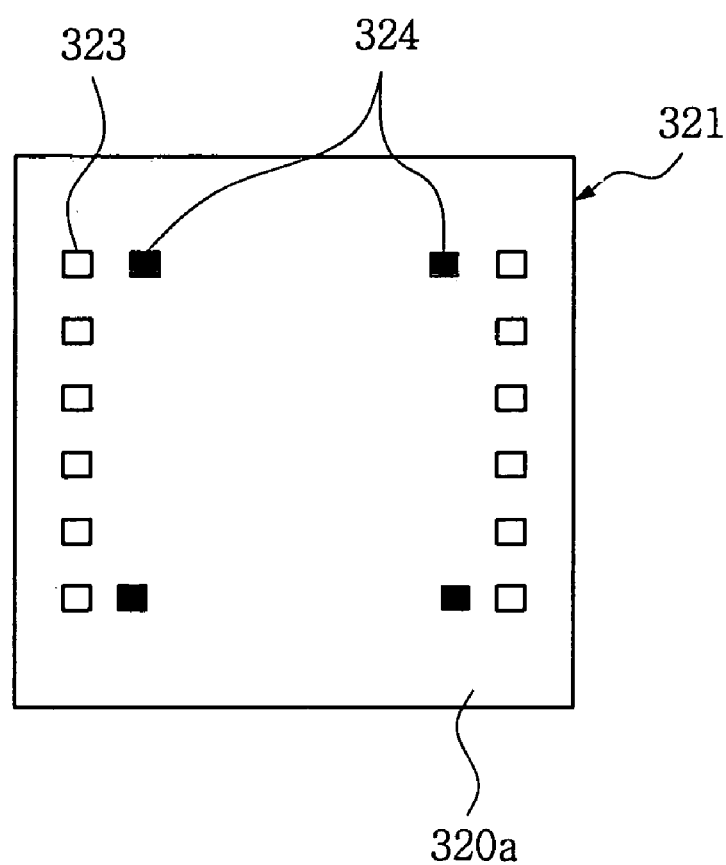
FIG. 3B is a plan view of dummy pads of FIG. 3A.
Figure 3C:
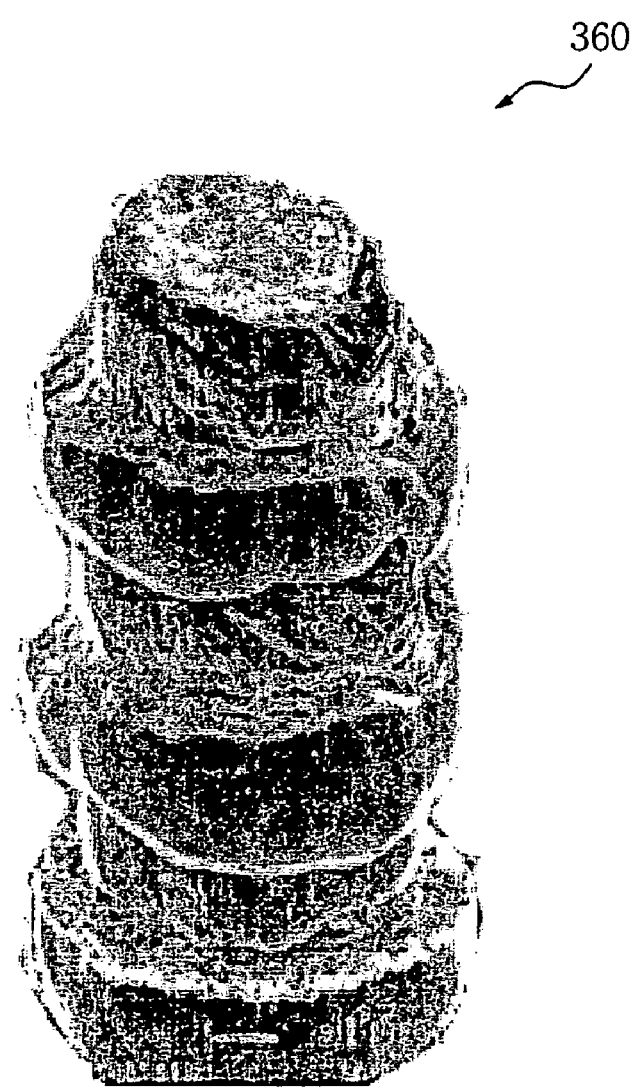
FIG. 3C is a photograph of a spacer that may be implemented in FIG. 3A.

FIG. 3A is a cross-sectional view of a chip stack package in accordance with an example embodiment of the present invention. FIG. 3B is a plan view of dummy pads of FIG. 3A. FIG. 3C is a photograph of a spacer that may be implemented in FIG. 3A.

Referring to FIGS. 3A and 3B, the chip stack package may include a package substrate 310, a first chip 321, a second chip 322, bonding wires 340, and spacers 360. The first chip 321 may be provided on the package substrate 310 and the second chip 322 may be provided on the first chip 321. By way of example only, the size of the first chip 321 may be equal to the size of the second chip 322. In alternative embodiments, the first and the second chips 321 and 322, respectively, may be of different sizes. The bonding wires 340 may electrically connect the first and the second chips 321 and 322, respectively, to the package substrate 310. The spacers 360 may be interposed between the first chip 321 and the second chip 322. Each of the spacers 360 may include a plurality of bumps 361. The bumps 361 may be fabricated from a metal. The bumps 361 may be fabricated from numerous other alternative materials that are well known in this art.

The package substrate 310 may have a substrate body 310a. The substrate body 310a may have an upper surface and a lower surface. Wiring patterns 310b may be provided on the upper surface of the substrate body 310a. The upper surface of the substrate body 310a may include a chip mounting area. The wiring patterns 310b may be arranged around the chip mounting area. In this example embodiment, the package substrate 310 may be a printed circuit board. In alternative embodiments, the package substrate 310 may be a lead frame that may have wiring patterns, a tape wiring substrate and/or a ceramic substrate. In this example embodiment, the wiring patterns 310b may be provided on the upper surface of the substrate body 310a. In alternative embodiments, wiring patterns may be further provided in the substrate body 310a and/or on the lower surface of the substrate body 310a. The wiring patterns 310b may be fabricated from Cu/Ni/Au, Cu/Ni/Cr/Au, and/or Cu/Ni/Co/Au.

The first chip 321 may have an active surface 320a. The active surface 320a may support a plurality of bonding pads 323 and nonconductive dummy pads 324. The first chip 321 may have a back surface 320b that may be opposite to the active surface 320a. The first chip 321 may be mounted on the package substrate 310 such that the back surface 320b may face the chip mounting area of the package substrate 310. By way of example only, the bonding pads 323 may be arranged along opposing edge portions of the active surface 320a. In alternative embodiments, the bonding pads 323 may be distributed over other portions of the active surface 320a. Bumps 325 may be provided on the bonding pads 323.

By way of example only, and with reference to FIG. 3B, four dummy pads 324 may be arranged on the active surface 320a. The dummy pads 324 may be located near the bonding pads 323. The dummy pads 324 may be positioned between opposing bonding pads 323. The dummy pads 324 may be formed while the bonding pads 323 are being formed. In alternative embodiments, more or less than four dummy pads 324 may be provided. In alternative embodiments, the dummy pads 324 may be located anywhere on the active surface 320a.

The bonding wire 340 may have one end that may be connected to the bonding pad 323 of the first chip 321 and another end that may be connected to the wiring pattern 310b of the package substrate 310. By way of example only, the bonding wire 340 may be applied via a bump reverse bonding technique. Here, the bonding wire 340 may be ball bonded to the substrate 310, and then stitch (or wedge) bonded to the first chip 321. The reverse bonding technique may reduce the height of the loop of the bonding wire 340.

The second chip 322 may have the same size and configuration as the first chip 321. The second chip 322 may be stacked on the first chip 321 using an adhesive layer 330. The adhesive layer 330 may be a liquid adhesive of a thermoplastic resin and/or a thermosetting resin(for example an epoxy resin), and/or an insulating adhesive tape (for example an epoxy-related thermoplastic resin, adhesive glass, and/or polymer). The adhesive layer 330 may provide a stable attachment of the second chip 322 to the first chip 321, may protect connected portions between the bonding wires 340 and the bumps 325 of the first chip 321 and may protect the active surface 320a of the first chip 321. Like the first chip 321, the second chip 322 may have an active surface 320a. The active surface 320a may support bonding pads 323 and may be electrically connected to the package substrate 310 via bonding wires 340. In alternative embodiments, the second chip 322 may have a different size and/or configuration than the first chip 321. By way of example only, the second chip 322 may not include dummy pads 324.

The spacer 360 may include a plurality of bumps 361. In this example embodiment, the bumps 361 may be fabricated from a metal. The spacer 360 may be provided on a corresponding dummy pad 324 of the first chip 321. The height of the spacer 360 may be greater than the height (h') of the bonding wire 340 from the active surface 320a of the first chip 321. By way of example only, the metal bumps 361 may be fabricated from Au and/or Ni. The metal bumps 361 may be fabricated using a stud bumping technique, for example. As shown in FIG. 3C, the uppermost metal bump 361 of the spacer 360 may have a substantially flat top side. This may reduce the likelihood of scratching the back surface 320b of the second chip 322, which may result from the contact between the back surface 320b of the second chip 322 and the top side of the uppermost metal bump 361.

The chip stack package may include an encapsulant (not shown) that may seal the first chip 321, the second chip 322 and the bonding wires 340. External connection terminals (not shown) may be provided on the lower surface of the package substrate 310.

In alternative embodiments, the chip stack package may include more that two chips. More specifically, in addition to the first and the second chips 321 and 322, respectively, the chip stack package may include an nth chip (n: natural number). For example a third chip, a fourth chip and/or a fifth chip may be stacked on the second chip 322 in the same manner that the second chip 322 is stacked on the first chip 321.

Figure 4A:
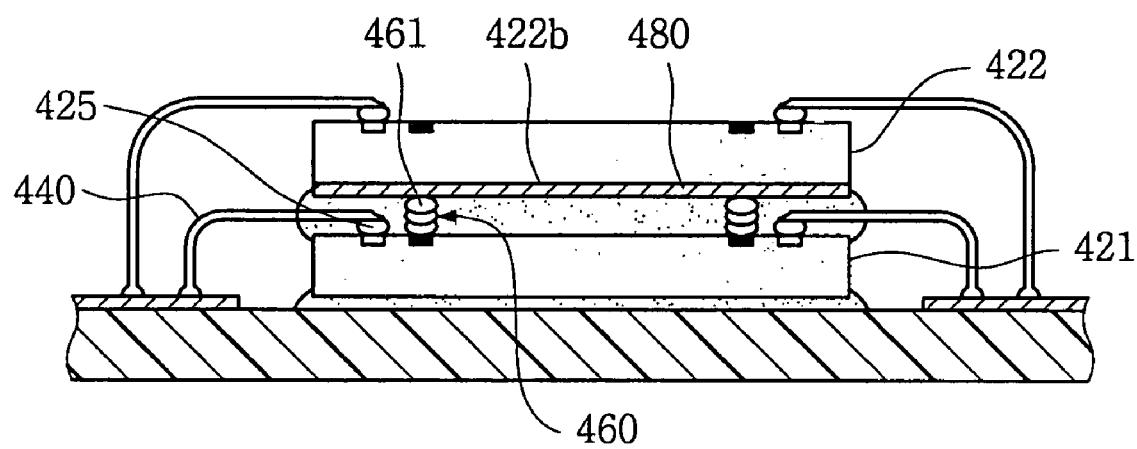
FIG. 4A is a cross-sectional view of a chip stack package in accordance with another example embodiment of the present invention.
Figure 4B:
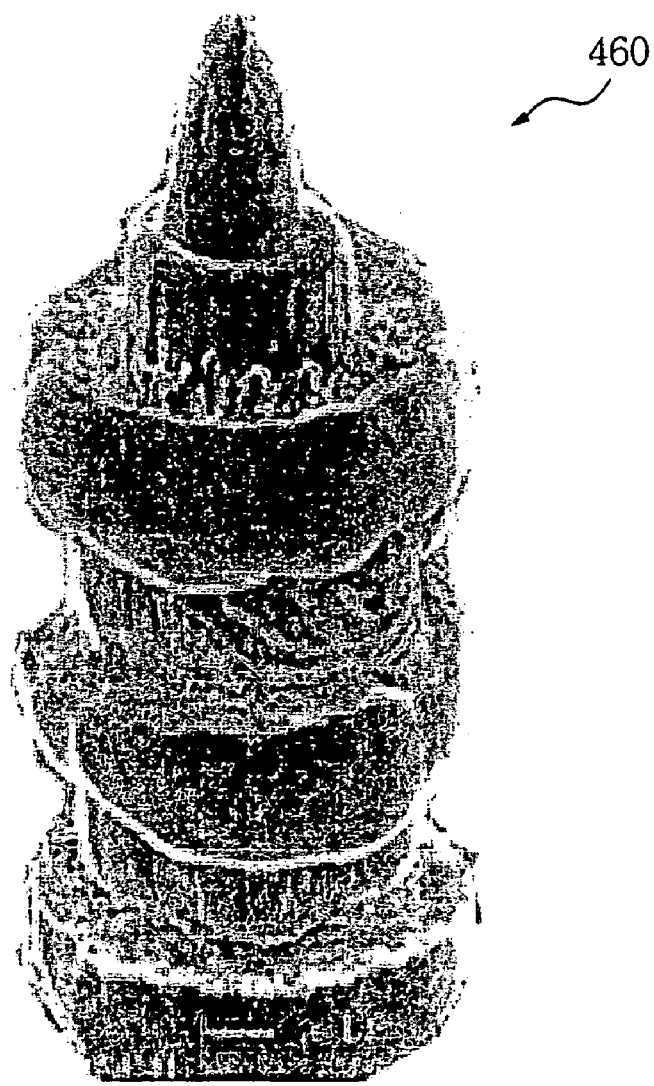
FIG. 4B is a photograph of a spacer that may be implemented in FIG. 4A.

FIG. 4A is a cross-sectional view of a chip stack package in accordance with another example embodiment of the present invention. FIG. 4B is a photograph of a spacer that may be implemented in FIG. 4A.

Referring to FIGS. 4A and 4B, the chip stack package may include a second chip 422 that may have an insulating layer 480, and a spacer 460 that may have a protrusion. In other respects, the chip stack package of this example embodiment may have a similar structure as the chip stack package of FIG. 3A. The second chip 422 may have a back surface 422b on which the insulating layer 480 may be provide. The insulating layer 480 may reduce the electrical interference between the back surface 422b of the second chip 422 and the bonding wires 440 of the first chip 421. By way of example only, the insulating layer 480 may be fabricated at wafer level and be formed from polyimide resin. The spacer 460 may include a plurality of bumps 461. In this example embodiment, the bumps 461 may be fabricated from a metal. The uppermost metal bump 461 of the spacer 460 may have a top side supporting a protrusion. The protrusion may be inserted into the insulating layer 480 of the second chip 422, which may stably support the relative positions of the first chip 421 and the second chip 422.

FIGS. 5A through 5F are cross-sectional views of a method that may be implemented to manufacture a chip stack package in accordance with an example embodiment of the present invention.

Figure 5A:
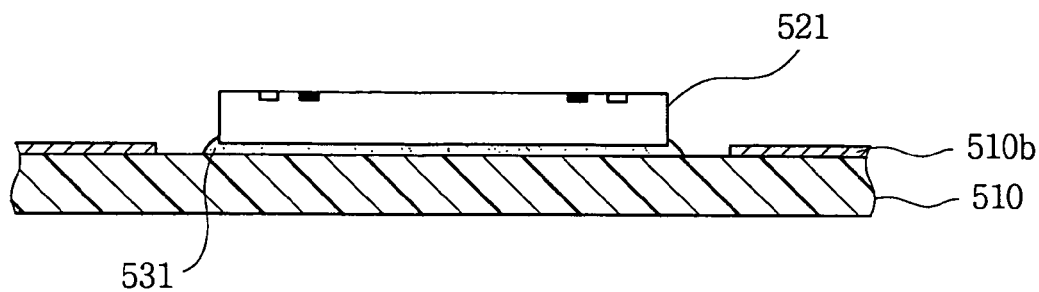
FIGS. 5A through 5F are cross-sectional views of a process for manufacture a chip stack package in accordance with an example embodiment of the present invention.

Referring to FIG. 5A, the method may involve providing a package substrate 510 that may have an upper surface (which may support wiring patterns 510b and which may include a chip mounting area), a first chip 521 and a second chip 522. Each of the first chip 521 and the second chip 522 may have bonding pads 523 and dummy pads 524. A first liquid adhesive 531 may be applied to the chip mounting area of the package substrate 510. The first liquid adhesive 531 may be a paste type thermosetting resin, for example an epoxy resin. By way of example only, the epoxy resin, which may be a mixture of a solvent and a resin, may be cured by volatilization of the solvent and reaction of the resin when the epoxy resin is heated to a temperature of between 100° C. and 200° C. The first chip 521 may be attached to the first liquid adhesive 531.

Figure 5B:
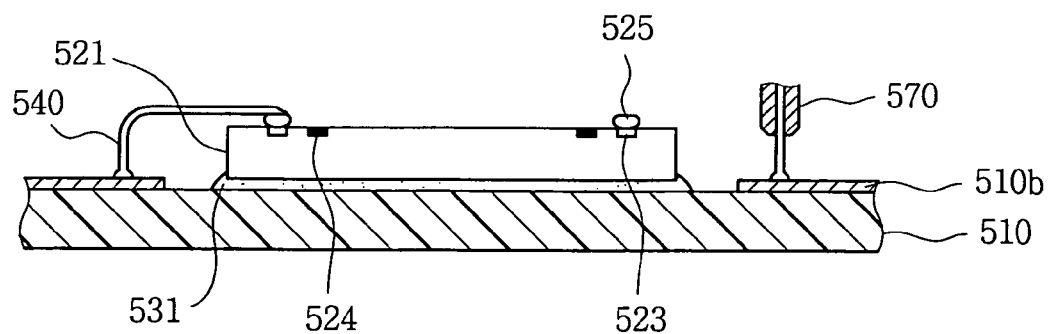

Referring to FIG. 5B, the bonding pads 523 of the first chip 521 may be connected to the wiring patterns 510b of the package substrate 510 using bonding wires 540. For example, the package substrate 510 may be mounted on a heating stage. The package substrate 510 may be heated to a temperature of between 150° C. and 200° C., and a wire bonding process may be performed. The bonding wire 540 may be applied using a bump reverse bonding technique. A wire bonder 570, which may implement ultrasonic vibration and thermocompression, may be used to carry out the bump reverse bonding technique. For example, the bump 525 may be formed on the bonding pad 523. A ball bonding process may be performed on the wiring pattern 510b so that one end of the bonding wire 540 may be connected to the wiring pattern 510b. A stitch bonding process may be performed on the bump 525 so that the other end of the bonding wire 540 may be connected to the bump 525.

Figure 5C:
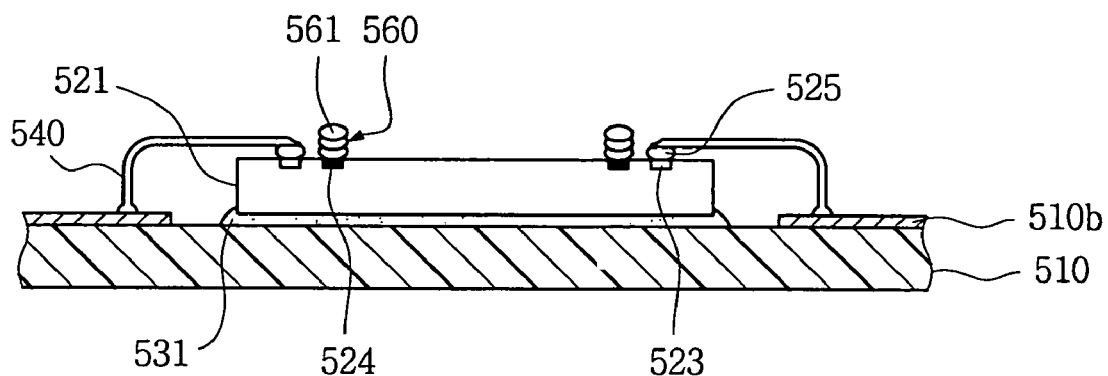

Referring to FIG. 5C, spacers 560 may be provided on the corresponding dummy pads 524 of the first chip 521. The spacer 560 may be formed by stacking a plurality of metal bumps 561. The spacer 560 may be fabricated using a conventional wire bonder. The spacers 560 may be fabricated during a wire bonding process. The metal bumps 561 and the bump 525 of the first chip 521 may be fabricated in a similar fashion and/or in the same process. The thickness of the metal bump 561 may be about 50 μm, for example. The spacer 560 may include three metal bumps 561. In alternative embodiments, the spacer 560 may include more or less than three metal bumps 561. The uppermost metal bump 561 of the spacer 560 may have a flat top (see FIG. 3C, for example) or a top having a protrusion (see FIG. 4B, for example).

Figure 5D:
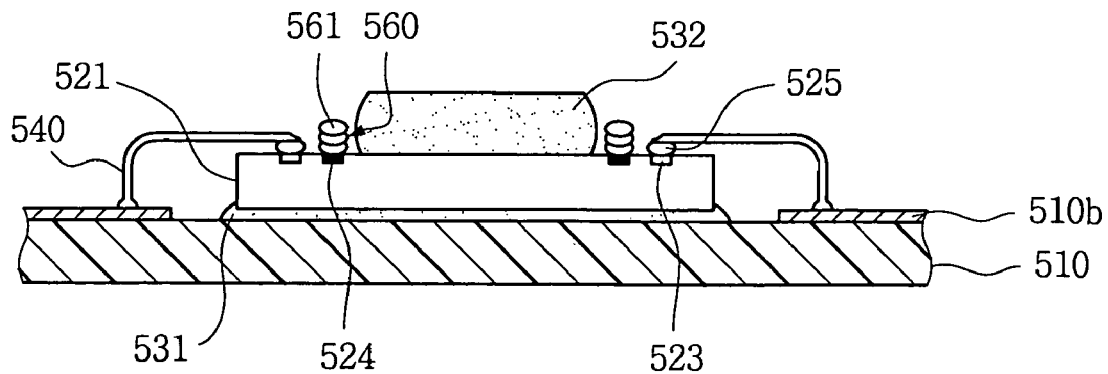

Referring to FIG. 5D, a second liquid adhesive 532 may be applied to the first chip 521. The second liquid adhesive 532 may be a paste type thermosetting resin, which may be the same as the first liquid adhesive 531. In alternative embodiments, the first and the second adhesives 531 and 532, respectively, may be different types of adhesives.

Figure 5E:
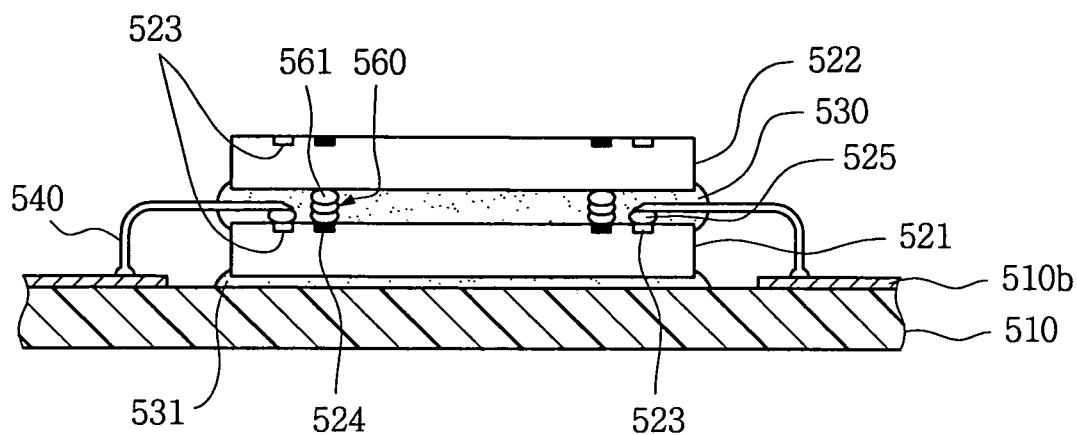

Referring to FIG. 5E, the second chip 522 may be attached to the second liquid adhesive 532 and be thermocompressed. For example, the package substrate 510 may be mounted on a heating stage. By way of example only, the second chip 522 may be pressed downwards on the second liquid adhesive 532, while the package substrate 510 may be heated to a temperature of between 100° C. and 250° C. The second liquid adhesive 532 may be cured to form the adhesive layer 530.

The second liquid adhesive 532 may be replaced with an adhesive film, for example a thermoplastic resin and/or an insulating adhesive tape.

Figure 5F:
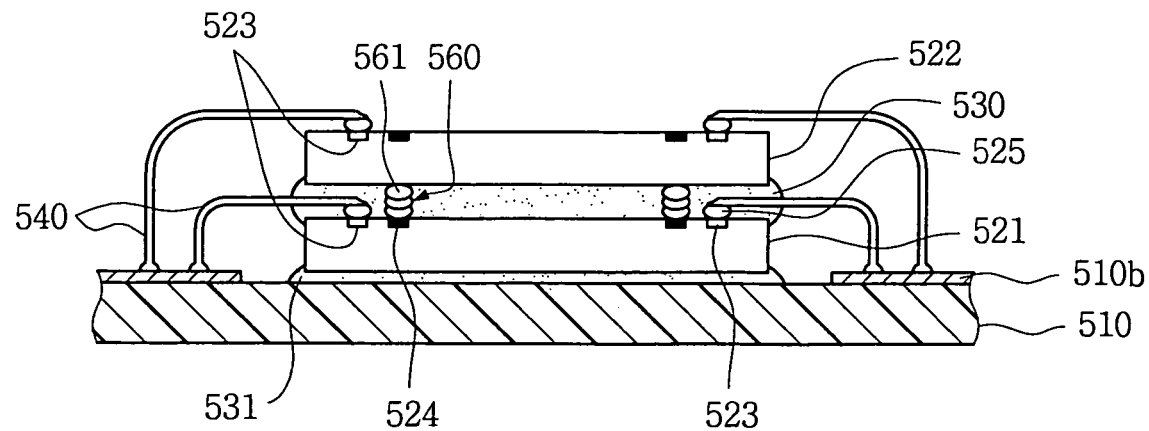

Referring to FIG. 5F, the bonding pads 523 of the second chip 522 may be connected to the wiring patterns 510b of the package substrate 510 using the bonding wires 540.

An encapsulant (not shown) may be provided to seal the first chip 521, the second chip 522 and the bonding wires 540. External connection terminals (not shown) may be provided on the lower surface of the package substrate 510.

In accordance with the example, non-limiting embodiments of the present invention, the chip stack package and method for manufacturing the chip stack package may include a plurality of semiconductor chips. Spacers, each of which may include a plurality of metal bumps, may be provided on dummy pads of one of the semiconductor chips to maintain the distance between the adjacent semiconductor chips, thereby providing a space for bonding wires.

In accordance with the example, non-limiting embodiments of the present invention, the chip stack package may have a reduced interface between the spacers and the semiconductor chip. This feature may (for example) reduce the likelihood that circuit patterns of the semiconductor chip may be damaged by mechanical shocks and/or thermal stresses due to the difference between the coefficient of thermal expansion of the spacer and that of the semiconductor chip.

The height of the spacer may be adjusted based on the height of the loop of the bonding wire by adjusting the quantity of the metal bumps.

While example, non-limiting embodiments have been shown and described, it will be understood by those skilled in the art that various changes in form and details may be made therein without departing from the spirit and scope of the invention as defined by the appended claims.

What is claimed is:

1. A package comprising:
   a substrate having wiring patterns;
   a first semiconductor chip having an active surface with bonding pads and nonconductive dummy pads, and a back surface opposite to the active surface, the first semiconductor chip mounted on the substrate;
   a second semiconductor chip having an active surface with bonding pads, and a back surface opposite to the active surface, the second semiconductor chip mounted on the first semiconductor chip;
   bonding wires electrically connecting the bonding pads of the first and the second semiconductor chips to the wiring patterns of the package substrate; and
   spacers interposed between the first and the second semiconductor chips, the spacers provided on the nonconductive dummy pads of the first semiconductor chip, each of the spacers including a plurality of metal bumps.

2. The package of claim 1, wherein the spacers have a height that is greater than the height of the boding wires from the active surface of the first semiconductor chip.

3. The package of claim 1, wherein the spacers are fabricated from Au.

4. The package of claim 1, wherein the uppermost metal bump of each of the spacers has a flat top side.

5. The package of claim 1, further including an insulating layer provided on the back surface of the second semiconductor chip.

6. The package of claim 5, wherein the uppermost metal bump of each of the spacers has a top side with a protrusion.

7. The package of claim 1, wherein the bonding wires are formed using a bump reverse bonding technique.

8. The package of claim 1, further including a liquid adhesive provided between the first and the second semiconductor chips.

9. The package of claim 1, further comprising:
   an encapsulant sealing the first and the second semiconductor chips and the bonding wires; and
   external connection terminals provided on a lower surface of the substrate.

10. A package comprising:
    a substrate;
    a first semiconductor chip mounted on the substrate and electrically connected to the substrate, the first semiconductor chip having an active surface with a nonconductive dummy pad;
    a second semiconductor chip mounted on the first semiconductor chip, the second semiconductor chip electrically connected to the substrate; and
    a spacer interposed between the first and the second semiconductor chips, the spacer provided on the nonconductive dummy pad of the first semiconductor chip, the spacers including a stack of bumps.

11. The package of claim 10, wherein the bumps are fabricated from a metal.

12. The package of claim 10, wherein the first and the second semiconductor chips are electrically connected to the substrate via bonding wires.

13. The package of claim 10, wherein the active surface of the first semiconductor chip and an active surface of the second semiconductor chip face away from the substrate.

14. The package of claim 10, wherein the second semiconductor chip has an active surface with a non-conductive dummy pad.

* * * * *